United States Patent [19]

Huang

[11] 4,051,464
[45] Sept. 27, 1977

[54] SEMICONDUCTOR MEMORY CELL
[75] Inventor: Jack S. T. Huang, New Hope, Minn.
[73] Assignee: Honeywell Inc., Minneapolis, Minn.
[21] Appl. No.: 611,295
[22] Filed: Sept. 8, 1975
[51] Int. Cl.$^2$ .......................................... G11C 11/40
[52] U.S. Cl. .............................................. 340/173 R
[58] Field of Search ............... 340/173 R; 357/23; 307/238

[56] References Cited
U.S. PATENT DOCUMENTS

| | | | |
|---|---|---|---|
| 3,728,695 | 4/1973 | Bentchkowsky | 340/173 R |
| 3,744,036 | 7/1973 | Bentchkowsky | 340/173 R |
| 3,836,992 | 9/1974 | Abbas et al. | 357/23 |

OTHER PUBLICATIONS

James, Electrically Rewritable Nonvolatile Storage Having Reduced Write Voltage, IBM Technical Disclosure Bulletin, vol. 16, No. 2, July, 1973, pp. 690–691.

*Primary Examiner*—Stuart N. Hecker
*Attorney, Agent, or Firm*—Theodore F. Neils

[57] ABSTRACT

An electrically alterable semiconductor memory cell is provided wherein a memory cell select line can be operated at a relatively low voltage.

8 Claims, 8 Drawing Figures

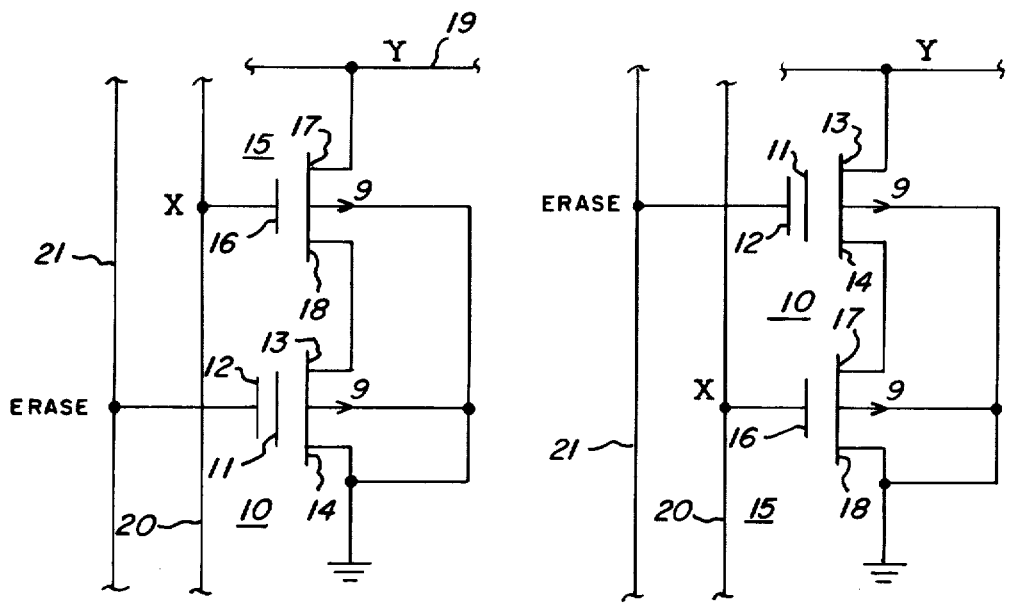
FIG. 1
(PRIOR ART)
FIG. 2
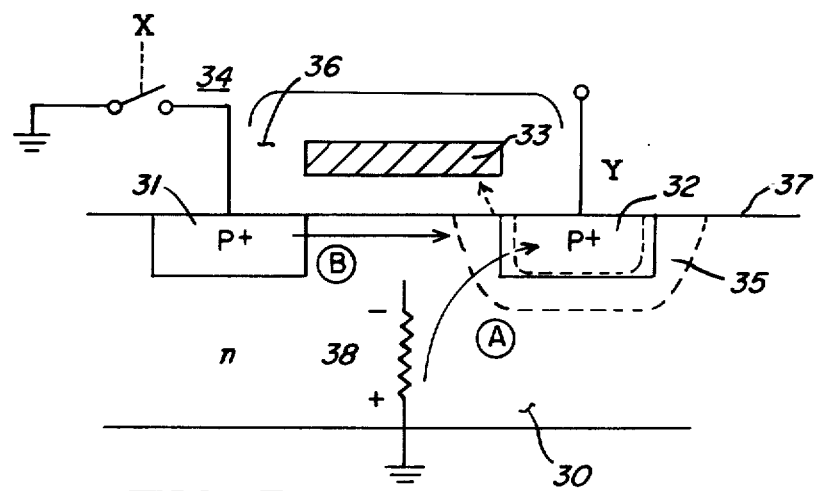
FIG. 3

SEMICONDUCTOR MEMORY CELL

BACKGROUND OF THE INVENTION

The invention described herein relates to semiconductor memories and more particularly to non-volatile, electrically alterable semiconductor memory cells.

Non-volatile, electrically alterable semiconductor memory cells have been developed to avoid use of semiconductor, mask programmable, read only memories and semiconductor, fusible link programmable, read only memories which, in general, are expensive and not reprogrammable. Some of the electrically alterable, semiconductor memory cells in the prior art rely on charge storage associated with a dielectric means used in a field effect transistor such as occurs in MNOS field effect transistors. Another electrically alterable semiconductor memory cell is based on a field effect transistor with a floating or electrically isolated gate wherein charge is stored on the floating gate after flowing through the insulating material surrounding the floating gate. The charge is provided on the floating gate is causing an avalanche breakdown of the semiconductor junction between the drain and the substrate of the field effect transistor of which the floating gate is part. The avalanche breakdown produces hot electrons, in a p-channel device, which are injected into the insulating material and flow to be trapped by the floating gate.

A memory cell circuit associated with this latter type of non-volatile, electrically alterable, i.e. semiconductor memory cell in monolithic integrated circuit form is shown in FIG. 1 where p-channel active devices are used, the field effect transistors, and the integrated circuit substrate, 9, is grounded. A floating gate field effect transistor, 10, has the source thereof, 14, grounded. The floating gate is designated by the numeral 11. The erasure gate, 12, for removing a bit written into the memory on transistor 10 is connected to the ERASE line. The drain thereof, 13, is connected to the source, 18, of the cell select or cell control p-channel MOS field effect transistor, 15. The drain, 17, of this latter transistor is connected to the "Y" writing/bit sensing line. The gate, 16, of the memory cell select transistor is connected to the "X" memory cell select or word select line, 20.

In operation, to write or program a bit into the memory cell, a negative voltage must be applied to the drain of the floating gate transistor 10 sufficient to cause an avalanche breakdown of the semiconductor or p-n junction occurring between the drain 13 and substrate 9. This is accomplished by applying a negative voltage to the Y line, typically in excess of 30 volts, a negative voltage to the X line of a value even more negative than that applied to the Y line, that is, more negative than the voltage value applied to the Y line by at least the threshold voltage of MOS transistor 15.

To read the cell, i.e. to sense whether the transistor 10 is in an "on" condition or an "off" condition, a substantial negative voltage is again applied to the Y line through a load, though less than that used in the writing operation. Also, a substantial negative voltage is applied to the X line. If a substantial charge has been accumulated on the floating gate 11 during a writing operation, both the floating gate transistor 10 and the select transistor 15 will be in the "on" condition when the X line voltage is applied. Otherwise, the floating gate transistor 10 will be in the "off" condition. The existing condition of the floating gate transistor 10 can be determined by the resulting voltage on the Y line.

A substantial difficulty with the circuit of FIG. 1 is the need for a large negative voltage to be applied to both the X and Y lines in operation. Large voltages in the metallization interconnection system in a monolithic integrated circuit chip lead to "channelling" problems and to dielectric breakdown problems. The likelihood of such problems is substantial where the particular metallization interconnection to which the high voltage is applied is routed over large portions of the monolithic integrated circuit as is the situation for the X and Y lines in a semiconductor memory chip.

Therefore, special design measures are required in routing the X and Y lines on such a monolithic integrated circuit chip and in the structure supporting these lines if these problems are to be avoided. Such design constraints in a monolithic integrated circuit chip could be substantially eased if the operating voltage used on one of these lines could be substantially reduced.

SUMMARY OF THE INVENTION

A non-volatile, electrically alterable semiconductor memory cell is provided wherein the cell writing voltage is applied to the memory field effect transistor and the cell select signal is applied to a cell selecting means connected to the memory field effect transistor. The cell selecting means is typically a MOS field effect transistor in series with the memory field effect transistor. The cell select signal is then low voltage applied to the gate of the select MOS field effect transistor. The memory transistor is typically a floating gate MOS field effect transistor. The select transistor sets the source of the memory field effect transistor at a selected voltage, typically the applied substrate voltage, if writing a bit in the memory cell is desired during a writing cycle. The select transistor either allows the source of the memory field effect transistor to float or to be connected to a reverse bias if it is desired to prevent writing in the memory cell during a write cycle.

BRIEF DESCRIPTION OF THE DRAWINGS

FIG. 1 is a circuit schematic diagram of a semiconductor memory cell known in the prior art, FIG. 2 is a circuit schematic diagram of the present invention, FIG. 3 is a circuit and monolithic integrated circuit structure diagram to facilitate understanding the present invention.

DESCRIPTION OF THE PREFERRED EMBODIMENTS

Figure 4A:
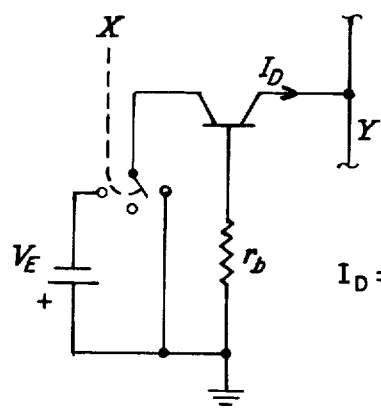
FIG. 4A and 4B are a circuit diagram and a graph to facilitate understanding the present invention.

Returning to FIG. 1, the cell writing voltage applied on the Y line must necessarily be of a sufficient magnitude to break down the drain-substrate semiconductor junction in the memory transistor 10 to cause charge to accumulate on the floating gate. Therefore, only the select signal voltage applied to the X line is a candidate among the two voltages for being a relatively small magnitude voltage as opposed to the substantial negative voltage required thereon in the circuit of FIG. 1 as described above.

One way to achieve this is shown in FIG. 2 where the positions of the field effect memory transistor 10, i.e. the floating gate field effect transistor, and the memory cell select transistor 15 have been interchanged. Other than this interchange, the circuit components in the circuit of FIG. 2 are the same as in FIG. 1 and so the same numeral designations have been retained. Again, the circuit of FIG. 2 is to be associated with a monolithic integrated circuit having p-channel active devices, i.e. the field effect transistors, with the integrated circuit substrate again being grounded.

At first glance, there seems to be an obvious shortcoming in the circuit of FIG. 2 in that the writing voltage applied to the Y line is applied directly between the drain 13 of the memory field effect transistor and the substrate without the select transistor controlling the application of this voltage as in FIG. 1. Thus, an immediate avalanche breakdown of the drain substrate junction appears to result without the presence or the absence of the memory cell select signal on the X line having any control as to whether the memory cell should be written into or not. Further, this would appear to be true of all similar semiconductor memory cells in the monolithic integrated circuit which are also connected to this Y line. Therefore, all of the cells on the Y line would apparently have the field effect memory transistor therein undergo an avalanche breakdown accompanied by an accumulation of charge on the floating gates in each of these memory transistors whenever the cell writing voltage appears on the Y line.

This indeed will be the result for a cell writing voltage applied to the Y line which exceeds the drain substrate junction breakdown voltage to sufficient extent. However, the applicant has discovered there is a range of cell writing voltages in which there will generally not be a sufficient breakdown of the drain-substrate semiconductor junction in the field effect memory transistor to cause charge accumulation on the floating gate thereof but in this range a sufficient breakdown can be selectively caused to occur. This selective breakdown of the memory field effect transistor occurs when the source thereof is in one condition, but does not occur when the memory transistor source is in another condition during times when the cell writing voltage in the above mentioned range is applied. An explanation of this begins with FIG. 3.

In FIG. 3, a cross-section is shown of a floating gate field effect memory transistor of the p-channel type as provided in a monolithic integrated circuit having the substrate thereof grounded. The substrate, 30, is of n-type material having a first major surface, 37, supporting an insulating material 36. The grounding of substrate 30 occurs at its second major surface. Both the source 31 and the drain 32 are of heavily doped p+-type material. A floating gate, 33, is provided of doped polysilicon and is both surrounded and supported by insulating material 36. This floating gate field effect memory transistor corresponds to the field effect memory transistor 10 of FIG. 2 but without the erasure gate which has been omitted in FIG. 3. Then also in correspondence with FIG. 2, a representative electrical contact line connected with the drain 32 is shown and marked "y" to correspond to the Y line shown in FIG. 2. However, no select transistor has been shown but rather a switch, 34, has been shown capable of connecting the source 31 to ground selectively under the control of a X line signal. This is shown for ease of understanding and emphasizes that the memory cell select means, whatever that means may be, need only perform the switching function in FIG. 3.

To write or program a bit in a selected semiconductor memory cell connected to the Y line, a negative cell writing voltage must be impressed on the Y line with respect to ground, that being the major surface of the substrate shown connected to ground in FIG. 3. For a voltage setting means providing cell writing voltage placing the Y line at a sufficent negative potential with respect to the substrate, a reverse bias current will flow across the drain-substrate junction, i.e. through the depletion region 35, associated with that p-n junction. This current is labeled by the circled A in FIG. 3. The magnitude of the cell writing voltage must be greater than some breakdown voltage which characterizes this junction to cause a breakdown of the drain-substrate semiconductor junction for this avalanche current to flow.

Insulating material 36 is typically silicon dioxide. As is known, see "Fowler-Nordheim Tunneling into Thermally Grown $SiO_2$", by M. Lenzlinger and E. H. Snow, *Journal of Applied Physics*, Vol. 40, Jan., 1969, pp. 278–282, the probability of electrons tunneling through insulating material 36, i.e. flowing to accumulate on floating gate 33, depends on a number of electrons available at the substrate-silicon dioxide interface along major surface 37 of the substrate. As a result of this relationship, it follows that a current threshold exists such that currents below this threshold lead to little or no electron tunneling and so no charge accumulation on the floating gate. Currents above this threshold current permit such tunneling and so charge to accumulate on the floating gate. The accumulation of charge on the floating gate 33 is equivalent to writing a bit into the memory cell since a sufficient amount of accumulated charge on the gate leads to an inverted region occurring between the source 31 and the drain 32, i.e. the field effect memory transistor is in an "on" condition being able to conduct current between the source and drain thereof.

Returning now to the application of the negative cell writing voltage to the Y line, the magnitude of the current A flowing across the drain-substrate junction will be determined by (i) the structure of the field effect memory transistor and of other circuits in the monolithic integrated circuit, and by (ii) the magnitude of the negative voltage occurring on the Y line in excess of the drain-substrate breakdown voltage. Where the voltage on the Y line has a sufficiently negative magnitude, the current A will be great enough to cause charge to accumulate on the floating gate 33 irrespective of what occurs at the source 31—the current A will always exceed the threshold current described above. However, there is a range of negative voltages which may be applied to the line Y which will result in a current A being insufficient to cause charge to accumulate on floating gate 33, at least with the source 31 in an open branch, i.e. switch 34 open. Closing switch 34, in this range of negative voltages on line Y, however, will lead to a current sufficient to cause charge to accumulate on floating gate 33 but not otherwise.

This appears to be explainable as follows. With switch 34 open, a negative voltage on the Y line in the voltage range described above will provide an initial avalanche current across the drain-substrate junction but of a value insufficient to exceed the current theshold required for charge to accumulate on the floating gate 33. This current flow will result in a voltage drop occurring within the substrate due to the resistance in the substrate which is represented by the resistor symbol 38 in FIG. 3, the polarity of the voltage drop being indicated along the symbol. This voltage drop in the substrate 30 will have little effect on the source-substrate junction when switch 34 is open as the source 31 just follows along, in potential, with the most negative voltage drop occurring in the substrate 30.

However, when switch 34 is closed in response to an X line signal, the source-substrate junction will be forward biased by the voltage drop occurring in the substrate 30, i.e. the voltage drop along symbolic resistor 38. Because of the lateral pnp transistor action occurring between the source and the drain, the hole current indicated by a circled B will be injected from the source acting as an emitter and flow to the drain depletion region 35 acting as a collector. This hole current is multiplied in the drain-substrate avalanching junction to thereby enhance the initial avalanche current A. There will also be a resulting electron current flow across the depletion region 35 into the substrate which further forward biases the source-substrate junction. Thus, this is a regenerative process resulting in a rapid increase in the number of avalanching electrons in the depletion region 35, i.e. a substantial increase in the avalanche current across the drain-substrate junction, increasing to a point exceeding the threshold current for charge accumulation on the floating gate. As a result, charge accumulates on floating gate 33 despite the negative voltage on line Y being insufficient to cause such charge accumulation when switch 34 was open. This regenerative process leads to a negative resistance characteristic in the avalanche region of the above mentioned pnp lateral transistor occurring in the memory field effect transistor in the "off" condition. An analysis of the characteristics of this lateral pnp transistor will be used to illustrate the conditions which do and do not lead to charge accumulating on the floating gate 33.

The equivalent circuit of the effective pnp transistor existing in the structure of FIG. 3 prior to substantial charge accumulating on the floating gate therein is shown in FIG. 4A. Again, the emitter in FIG. 4A represents the source 31 in FIG. 3, the collector in FIG. 4A represents the drain 32 in FIG. 3, the base in FIG. 4A represents the substrate 30 in FIG. 3 and, finally, the base resistor in FIG. 4A labeled $r_b$ represents the symbolic resistor 38 of FIG. 3. The collector carries a current $I_D$ and is connected to the Y line while the switch in the emitter circuit is controlled by signals on the X line and can be switched to one of three positions.

Figure 4B:
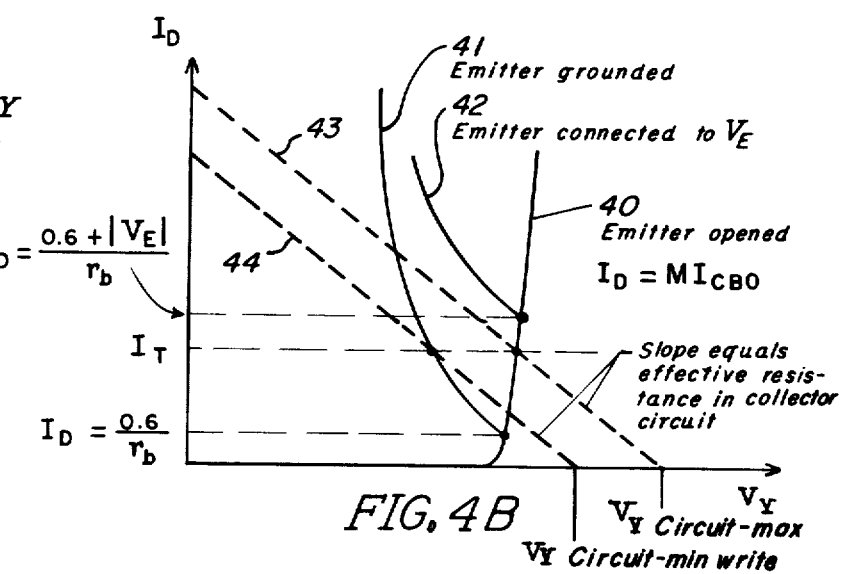

In the graph of FIG. 4B accompanying the equivalent pnp circuit of FIG. 4A, the collector characteristics of the pnp transistor are plotted. Curve 40 represents the collector characteristic when the switch in the emitter circuit controlled by signal line X is in the open position. An equation is given for curve 40 in FIG. 4B for operation in the avalanche region, the equation relating the collector current of the pnp transistor, $I_D$, to the avalanche multiplication factor, M, and the current $I_{CBO}$, from the collector to the base with the emitter circuited when the collector junction is not in a state of avalanche breakdown.

The pnp transistor collector operates along curve 40 when the emitter circuit is open, i.e. by having the switch controlled by signal line X in the middle position. Collector circuit operation can be determined by plotting the collector circuit load line in FIG. 4B and the intersection of the load line and the collector characteristic determines the transistor operating point. The greater the applied voltage in the collector circuit, the farther from the origin is located the load line. Load line slope is determined by the effective collector circuit resistance, including Y decoder effective resistance, switch means 34 effective resistance, etc.

An open emitter circuit corresponds with a desire that charge not be accumulated on the floating gate and so the threshold current, $I_T$, for tunneling on the insulating material must not be exceeded. The intersection of a load line and the curve 40, for the emitter circuit open, indicates the current flowing in the collector of the pnp transistor or, equivalently the current flowing in the drain of the structure shown in FIG. 3, and the voltage occurring across this transistor. This is the current which must not exceed threshold current $I_T$ in the graph in FIG. 4B, if charge is to be prevented from accumulating on the floating gate in the structure of FIG. 3. Thus, the load line intersecting curve 40 at $I_T$, designated 43, represents the maximum voltage which may be applied in the collector circuit for the effective resistance represented by this load line. So, $V_{Y\ circuit-max}$ is the maximum voltage which can be supplied in the Y line circuit if the field effect memory transistors in each memory cell connected thereof are not to each have a bit written therein upon application of the cell writing voltage along the Y line irrespective of signals on the pertinent X line. Any voltage greater than $V_{Y\ circuit-max}$ on the Y line will cause every cell on the Y line to have a bit written therein without regard to the voltage applied to the pertinent X line.

When the emitter is grounded by switch 34, as controlled by the signal line X, the collector characteristic of the pnp transistor changes, following along the same locus as curve 40 until the emitter junction in FIG. 40A, or the source-substrate junction in FIG. 3, is forward biased which occurs when the current $I_D$ equals $0.6/r_b$. Beyond that point, the onset of the regeneration action described above leads to a negative resistance characteristic and the collector characteristics becomes curve 41 in FIG. 4B.

A second load line, 44, has been drawn having the same slope as the first assuming the effective resistance in the collector circuit remains the same. Load line 44 intersects curve 41 at the point where the current in the pnp transistor collector, or in the drain in FIG. 3, with the emitter grounded, just equals threshold current $I_T$. The voltage giving rise to load line 44, $V_{Y\ circuit-min\ write}$ can be seen to be the smallest voltage supplied in the Y line circuit which will result in charge accumulating on the floating gate of the field effect memory transistor in FIG. 3. Thus, the range of cell writing voltages applied in the collector circuit which will allow selectively writing a bit into the memory cell are those between the intersections of the two load lines 43 and 44 and the horizontal axis labelled $V_Y$. This, of course, is for the source in FIG. 3 operating between open circuit condition and being grounded in response to signals on signal line X.

Also shown in FIG. 4A is a voltage source in the emitter circuit which acts to reverse bias the emitter junction, or equivalently, to reverse bias the source-substrate junction in FIG. 3. Such a reverse bias voltage may be useful in certan circumstances and does not necessarily result in detrimental operation. The emitter in FIG. 4A may be operated at $V_E$ rather than being open circuited when the memory cell is not selected by having switch 34 of FIG. 3, as a voltage setting means, operate the emitter between ground and $V_E$. In this situation, the collector characteristic will follow along curve 40 of FIG. 4B until a break point is reached equal to $(0.6 + |V_E|)r_B$. The pnp collector characteristic will then follow curve 42. If the break point for this curve is kept above $I_T$, no difference in operation will result. However, if this break point is moved below $I_t$ by the selection of $V_E$, the range of voltages in which selective writing in the memory cell occurs will be narrowed. Further, it is clear that the effective resistance in the collector circuit must be controlled so that the slope of the load line 43 and 44 do not become so steep that other intersections of these load lines with the collector characteristics of the pnp transistor occur upsetting the operation described above.

Figure 5A:
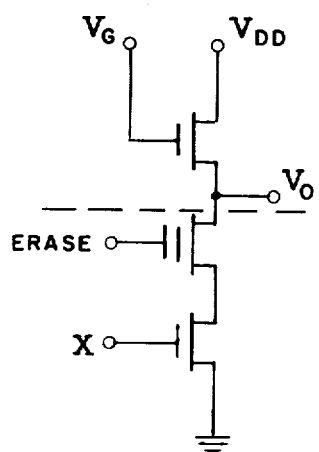
FIG. 5A and 5B are a circuit diagram involved with the present invention and a graph to facilitate understanding the present invention.

Turning now to FIG. 5A, a typical circuit portion to read the memory cell of FIGS. 3 and 4 is shown, where the memory cell corresponding to FIGS. 2, 3 and 4 is shown below the dashed line in the circuit drawn in FIG. 5A. Above the dashed line, a MOS transistor is provided to serve as a load for the memory cell during a read cycle.

Figure 5B:
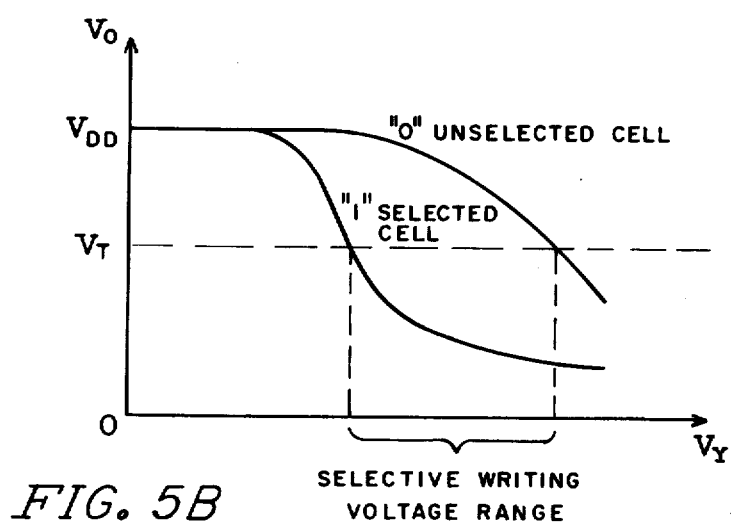

The graph shown in FIG. 5B plots the output voltage from the memory cell on one axis versus the voltage applied to the memory field effect transistor in a preceding writing cycle, $V_Y$. The graph shows the memory cell output voltage obtained during a read cycle, $V_O$. This voltage will indicate by being above a voltage level $V_T$ that the memory cell repesents a "0" and so was not selected during the preceding writing cycle in that no select signal was present on the X line coincident with the occurrence of the cell writing voltage $V_Y$ on the memory transistor. However, the graph shows this will be true only if the voltage $V_{Ycircuit}$ in the preceding writing cycle was not so large that $V_Y$ exceeded the selective writing voltage range. $V_O$ will indicate the memory cell is in a "1" state if the memory cell was selected to have a bit written into it during the preceding writing cycle by the voltage $V_O$ having a magnitude less than $V_T$. Typically, $V_T$ represents the magnitude of the threshold voltage of a MOS field effect transistor.

Figure 6:
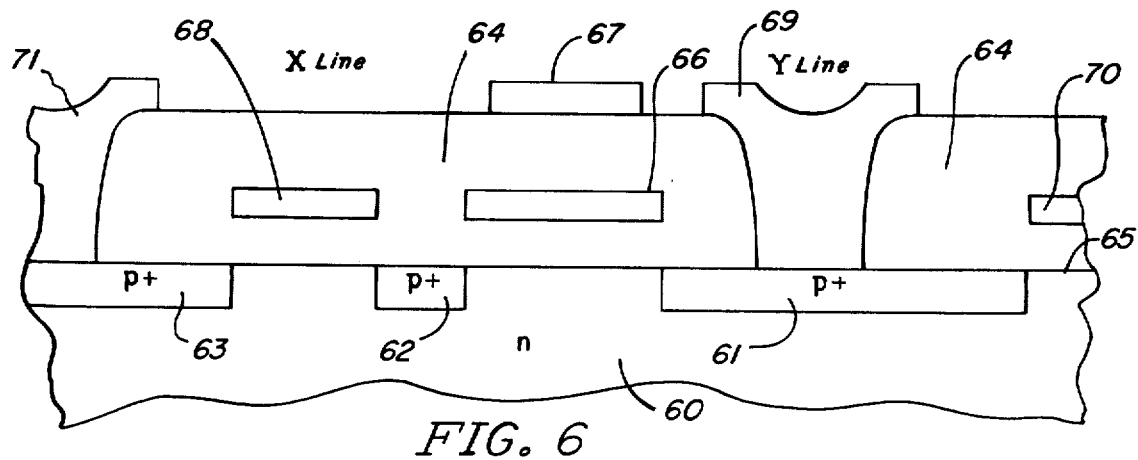
FIG. 6 is a cross-section diagram of a monolithic integrated circuit utilizing the present invention.

FIG. 6 shows a cross-section of a monolithic integrated circuit construction for a portion thereof including the memory cell described above. A truncated monolithic integrated circuit substrate, 60, is shown. This is an n-type substrate having a donor concentration of $10^{15}$ atoms/cm$^3$, typically phosphorous atoms. The first $p+$ region shown is the drain for the field effect memory cell transistor, 61. The second $p+$ region, labelled 62, is the source for the memory field effect transistor which also serves as the drain for the select transistor. The last $p+$ region shown is the source for the select transistor and is designated 63. These $p+$ regions are heavily doped $p$ regions having an accepter concentration of greater than $10^{17}$ atoms/cm$^3$, typically boron atoms. A silicon dioxide insulating material, 64, is disposed on a first major surface, 65, of the substrate 60. The insulating material 64 supports and surrounds a doped polysilicon floating gate, 66, with the polysilicon being doped typically with boron to a concentration of around $10^{19}$ atoms/cm$^3$. Insulating material 64 also supports thereabove an erasure gate, 67, also of doped polysilicon, but which could be provided by aluminum metallization. The doping of the erasure gate is again of boron in a concentration of $10^{18}$ to $10^{19}$ atoms/cm$^3$.

The separation between floating gate 66 and major surface 65 is around a thousand angstroms while the separation between the floating gate 66 and the erasure gate 67 is about 2,000 angstroms. During an erasing cycle, the drain and the source of the field effect memory transistor, 61 and 62, are grounded and a positive potential is applied to erasure gate 67 to attract electrons from the floating gate toward the erasure gate to allow the field effect memory transistor to assume an "off" condition. In addition, erasure gate 67 can be used to facilitate writing a bit into the memory cell. A small positive voltage on the ERASE gate, much less than that needed for erasing, can help attract avalanche electrons during a write cycle to reduce the required cell writing voltage magnitude considerably.

Several interconnection portions are shown in FIG. 6. One portion shown is the gate for the select transistor, 68, which is a portion of the X select line to which select transistors from several memory cells are connected. Line or gate 68 is provided at time floating gate 66 is provided and is of the same doped polysilicon material. Of course, gate 68 is not a floating gate despite its appearance in FIG. 6.

Also shown is the aluminum metalization portion for the Y line, 69, which is connected to drain 61 of the field effect memory transistor and to the drains of memory transistors in several other memory cells to none of which is the X line shown in FIG. 6 connected. Drain 61 is also shown serving as a source for another field effect transistor which may be a part of the sensing or writing circuitry provided in the integrated circuit chip, and a portion of a doped polysilicon gate for this last transistor, 70, is shown. Finally, a metallization interconnection portion, 71, in ohmic contact with the source of the select transistor, is shown.

As stated, the Y line will typically interconnect the drains of a number of field effect memory transistors in a corresponding number of memory cells provided in the monolithic integrated circuit. When a cell writing voltage is applied to the Y line, there will be an avalanche current drawn through the drain substrate junctions of all of these drain interconnected field effect memory transistors. The X line will have several select transistor gates connected to it also in a monolithic integrated circuit, but will be connected to only one of the memory cells which are connected to the Y line. Therefore, when a cell writing voltage appears on the Y line, only that field effect memory transistor which has the select signal provided to it along the X line will supply enough avalanche current across its drain-substrate junction to cause the floating gate provided therewith to accumulate sufficient charge to be placed in the "on" condition.

There are typically, of course, several memory cells in a monolithic integrated circuit beyond those connected to the X line and the Y lines described above. Thus, the memory cells may be thought of as connected in a grid arrangement with several lines similar to the X line and several other lines similar to the Y line. Each memory cell has its own X and Y connections which are selected through decoder circuits.

While all the memory cells connected on a Y line pass an avalanche current due to the drain-substrate junctions being reversed biased into the avalanche breakdown region, the writing occurs in a selected cell on the order of one microsecond and so no significant heating need occur before the cell writing voltage is removed from the Y line. Also, the voltage drop along the interior portions of the semiconductor substrate are limited to not being more than the forward voltage drop across the source-substrate junction of the field effect memory transistor in the selected memory cell. Therefore, this slight forward biasing of the substrate does not adversely affect other circuits which may be on the monolithic integrated circuit chip such as the decoder circuits and the sense circuits.

The preceding discussion and the monolithic integrated circuit which is shown in cross-section in FIG. 6 have all assumed p-channel active devices for the floating gate field effect memory transistor and the select transistors. However, n-channel active devices could also be used in which case holes would be injected into the insulating means surrounding and supporting the floating gates. These would be collected by the floating gates to accumulate the charge required to change the state of the floating gate field effect memory transistor. While holes do not tunnel as easily through insulating means as do electrons, a monolithic integrated circuit using n-channel active devices could certainly be provided which would improve the speed with which the memory cell therein could be read because of the more rapid switching available in n-channel MOS transistors.

The embodiments of the invention in which an exclusive property or right is claimed are defined as follows:

1. A memory cell circuit provided in a semiconductor device having a semiconductor substrate of a first conductivity type except for selected regions thereof including first and second selected regions, said selected regions having a second conductivity type such that a semiconductor junction is formed between first conductivity portions of said substrate and each of said selected regions including a first semiconductor associated with said first selected region and a second semiconductor junction associated with said second selected region, said semiconductor substrate having first and second major surfaces, said memory cell circuit comprising:

a memory cell including at least a field effect memory transistor comprising:
   said first selected region which intersects said first major surface,
   said second selected region which intersects said first major surfaces and which is spaced apart from said first selected region in said first major surface, and
   insulating means disposed on said first major surface with said insulating means having provided therewith a first gate conductive means, said first gate conductive means being located at least in part by that region of said first major surface which is between said first and second selected regions but with said first gate conductive means separated from said first major surface by said insulating means; and associated memory cell means associated with said memory cell including:
   a voltage setting means which, in response to a writing signal, selectively impresses between said first selected region and first conductivity portions of said semiconductor substrate a cell writing voltage of a value to reverse bias said first semiconductor junction, but where also said cell writing voltage is of a value insufficient to cause significant accumulation of charge on said first gate conductive means if solely impressas aforesaid while, concurrently, any significant current is prevented from flowing through said second selected region; and a voltage setting active device formed at least in part in said substrate which, in response to a select signal being provided thereto to indicate in conjunction with said writing signal that said memory cell has been selected, selectively places said second selected region at a voltage value to effectively forward bias said second semiconductor junction sufficiently to allow charge to accumulate in said first gate conductive means to an extent permitting said field effect memory transistor to be in an "on" condition when said cell writing voltage is concurrently impressed as aforesaid, said voltage setting active device being capable of selectively placing said second selected region at a voltage value as a foresaid when said select signal has a magnitude substantially smaller than that of said writing signal, and said voltage setting active device, in response to said select signal provided thereto indicating said memory cell has not been selected, places said second selected region at a voltage value which provides a reverse bias on said second semiconductor junction.

2. The apparatus of claim 1 wherein said voltage value at which said voltage setting active device places said second selected region when said memory cell has been selected is substantially equal to a voltage value occuring in said first conductivity portions of said semiconductor substrate.

3. The apparatus of claim 2 wherein said voltage setting active device, in response to said select signal provided thereto indicating said memory cell has not been selected, causes that circuit branch in which said second selected region is located to be substantially open.

4. The apparatus of claim 1 wherein said voltage setting active device, in response to said select signal provided thereto indicating said memory cell has not been selected, causes that circuit branch in which said second selected region is located to be substantially open.

5. The apparatus of claim 1 wherein said voltage setting active device is a MOS field effect transistor having a source and drain with each being one of said selected regions and having a second gate conductive means to which said select signal is provided, said first gate conductive means being completely surrounded by said insulating means.

6. The apparatus of claim 5 wherein said drain of said MOS field effect transistor is also said second selected region.

7. The apparatus of claim 6 wherein said source of said MOS field effect transistor is electrically connected to said semiconductor substrate.

8. The apparatus of claim 6 wherein a third gate conductive means is provided near said first conductive gate means, said third conductive gate means being capable upon being selectively set at a voltage level of substantially dissipating any charge accumulated on said first gate conductive means.

* * * * *